United States Patent [19]

Honnigford et al.

[11] Patent Number: 5,408,133

[45] Date of Patent: Apr. 18, 1995

[54] RAMP CONTROL CIRCUIT

[75] Inventors: Edward H. Honnigford, Russiaville; William J. Hulka, Kokomo, both of Ind.

[73] Assignee: Delco Electronics Corporation, Kokomo, Ind.

[21] Appl. No.: 55,593

[22] Filed: May 3, 1993

[51] Int. Cl.6 .......................... H03K 4/06; H03K 17/56
[52] U.S. Cl. ...................................... 327/134; 327/108
[58] Field of Search ............... 307/228, 263, 268, 246, 307/603, 270; 328/181, 184, 185; 365/189.08, 204

[56] References Cited

U.S. PATENT DOCUMENTS

| | | | |
|---|---|---|---|
| 3,708,692 | 1/1973 | Matuoka | 307/228 |
| 3,916,224 | 10/1975 | Daniels et al. | 328/181 |
| 4,488,060 | 12/1984 | Simko | 307/263 |
| 4,516,036 | 5/1985 | Miller | 307/228 |
| 4,644,250 | 2/1987 | Hartgring | 302/263 |
| 4,703,196 | 10/1987 | Arakawa | 302/246 |
| 4,823,317 | 4/1989 | Brahambhatt | 365/189 |
| 4,855,622 | 8/1989 | Johnson | 307/456 |
| 4,859,955 | 8/1989 | Trethewey | 328/169 |
| 4,878,164 | 10/1989 | Colombo | 363/49 |
| 4,888,498 | 12/1989 | Kadakia | 307/296.4 |
| 4,942,341 | 7/1990 | Imaizumi | 315/403 |
| 5,241,494 | 8/1993 | Blyth et al. | 365/45 |

Primary Examiner—Timothy P. Callahan
Assistant Examiner—Dinh Le
Attorney, Agent, or Firm—Anthony Luke Simon; Jimmy L. Funke

[57] ABSTRACT

An apparatus for providing an EEPROM programming signal, comprises a charge pump circuit for receiving a programming input signal on a programming input line and for charging up a gate drive voltage signal in response to a rising edge of the programming input signal. A transistor that includes a gate coupled to the gate drive signal couples the programming input line to a programming output line, which is coupled to an EEPROM. A ramp control circuit including (i) a capacitor and (ii) a transistor controlling the flow of current through the capacitor, is coupled to the programming output line for regulating a ramp-up rate of a programming output signal on the programming output line. A ramp-down circuit is coupled to the programming input line and to the programming output line and is responsive thereto for providing a ramp-down of the programming output signal after the programming input signal goes low.

4 Claims, 3 Drawing Sheets

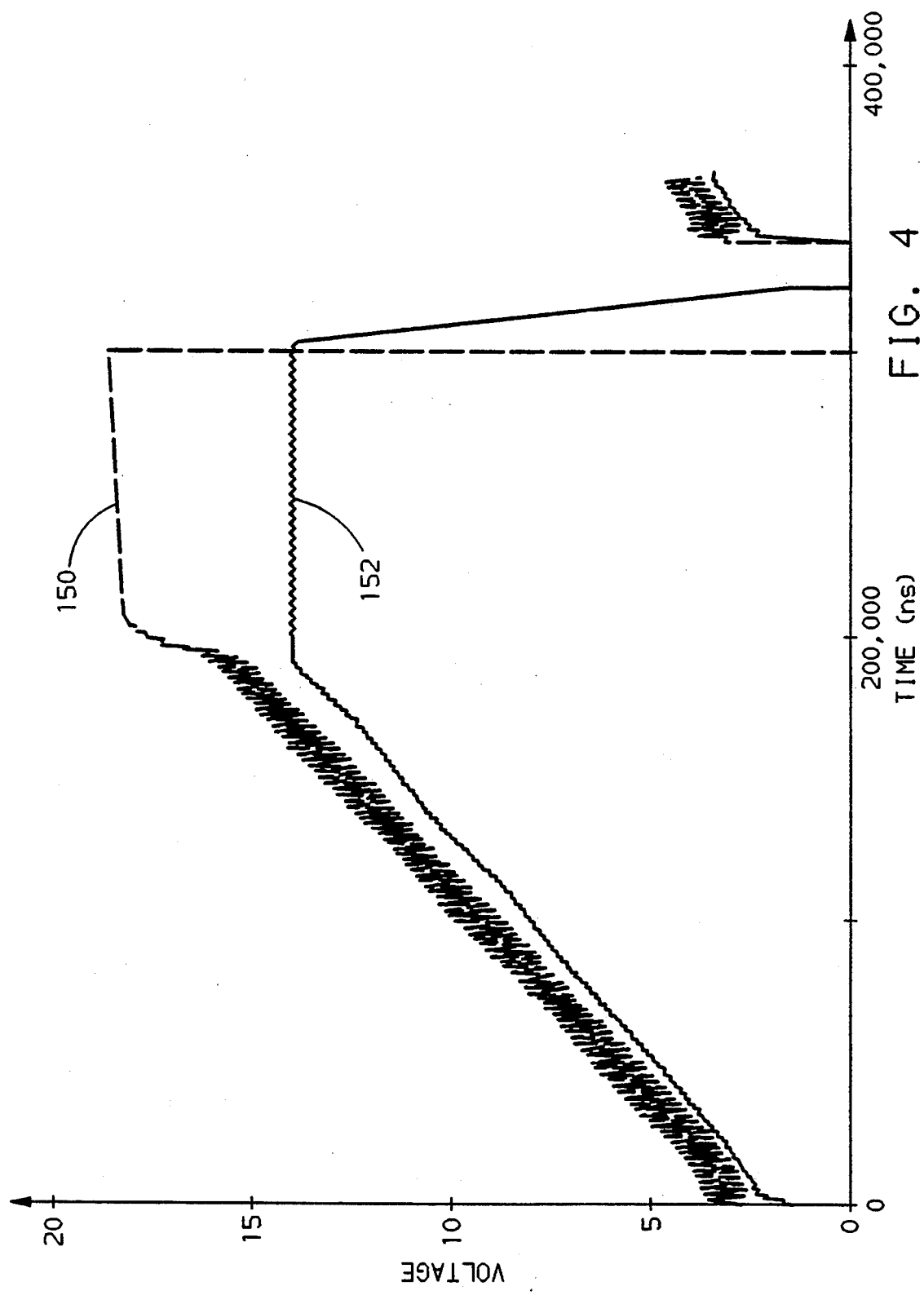

RAMP CONTROL CIRCUIT

This invention relates to programming of EEPROMs and more particularly to a ramp control circuit for controlling the programming signal of an EEPROM.

BACKGROUND OF THE INVENTION

Typically, memory circuits such as EEPROMs are operated at a fixed voltage provided by a regulated voltage supply, i.e., 5 volts. The EEPROM circuits are characteristically programmable in response to a high level programming signal. The programming signals are generally provided at a voltage level higher than the normal operating voltage of the EEPROM, i.e., on the order of 14 volts.

SUMMARY OF THE PRESENT INVENTION

Advantageously, this invention provides a ramp control circuit for use in programming EEPROM's that controls the ramp-up time of the programming signal to the EEPROM. Advantageously, the circuit of this invention controls the ramp-down time of the EEPROM programming signal preventing forward biasing of junctions of the EEPROM circuit. Advantageously, the programming signal ramp-up and ramp-down times according to this invention are independent of load applied to the programming signal source. Advantageously, the apparatus of this invention provides a low resistance path from a programming signal source to an EEPROM, minimizing the voltage drop between the signal source and the EEPROM.

Structurally, the apparatus of this invention comprises a charge pump controlling ramp-up of a gate drive signal in response to a programming signal, a transistor coupling the programming signal input to a programming output responsive to the charge pump gate signal, a ramp control circuit coupled to the programming output line comprising means for limiting the rate at which a signal on the programming output line may be ramped-up and a pull-down circuit for sensing a falling edge of the programming signal and providing controlled ramp-down of the programming output signal in a manner to avoid forward biasing of EEPROM circuit junctions.

A more detailed description of this invention is set forth below.

BRIEF DESCRIPTION OF THE DRAWINGS

FIG. 4 illustrates gate and programming signals according to this invention.

DETAILED DESCRIPTION OF THE INVENTION

This invention is for use with a typical EEPROM characterized by (i) normal operation at a fixed voltage, i.e., 5 volts, and (ii) programming operation in response to a programming signal at a voltage higher than the normal operating voltage, i.e., a programming signal on the order of 14 volts. EEPROMs of this nature are well known to those skilled in the art.

Figure 1:
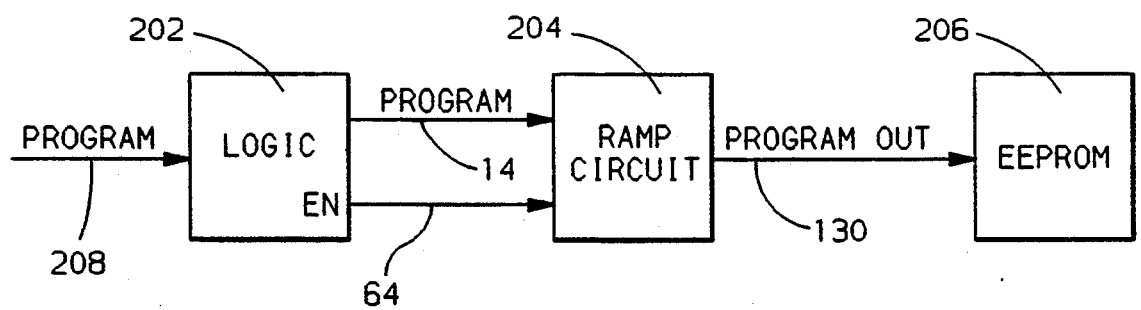
FIG. 1 illustrates a block diagram of an EEPROM programming circuit using the apparatus of this invention.

Referring to FIG. 1, EEPROM programming using the apparatus of this invention includes a program signal line 208, which provides a programming signal on the order of 14 volts to logic circuitry 202. Logic circuitry 202 responsively provides the programming signal (SCLK) on line 14 and an enable signal (EN) on line 64 to the ramp circuit 204 of this invention. Logic circuitry 202 provides the signals SCLK and EN on lines 14 and 64 according to the timing diagram shown in FIG. 3 (discussed below), by sensing the rising edge of the programming signal and responsively providing the rising edge of the signal EN with a slight delay. Similarly, logic circuitry 202 senses the falling edge of the programming signal and causes EN to fall after a slight delay, so that EN trails the programming signal with a slight delay. Those skilled in the art can easily implement logic circuitry 202 to perform these described functions and any circuit for providing the signals SCLK and EN as described in FIG. 3 may be used with this invention.

Figure 2:
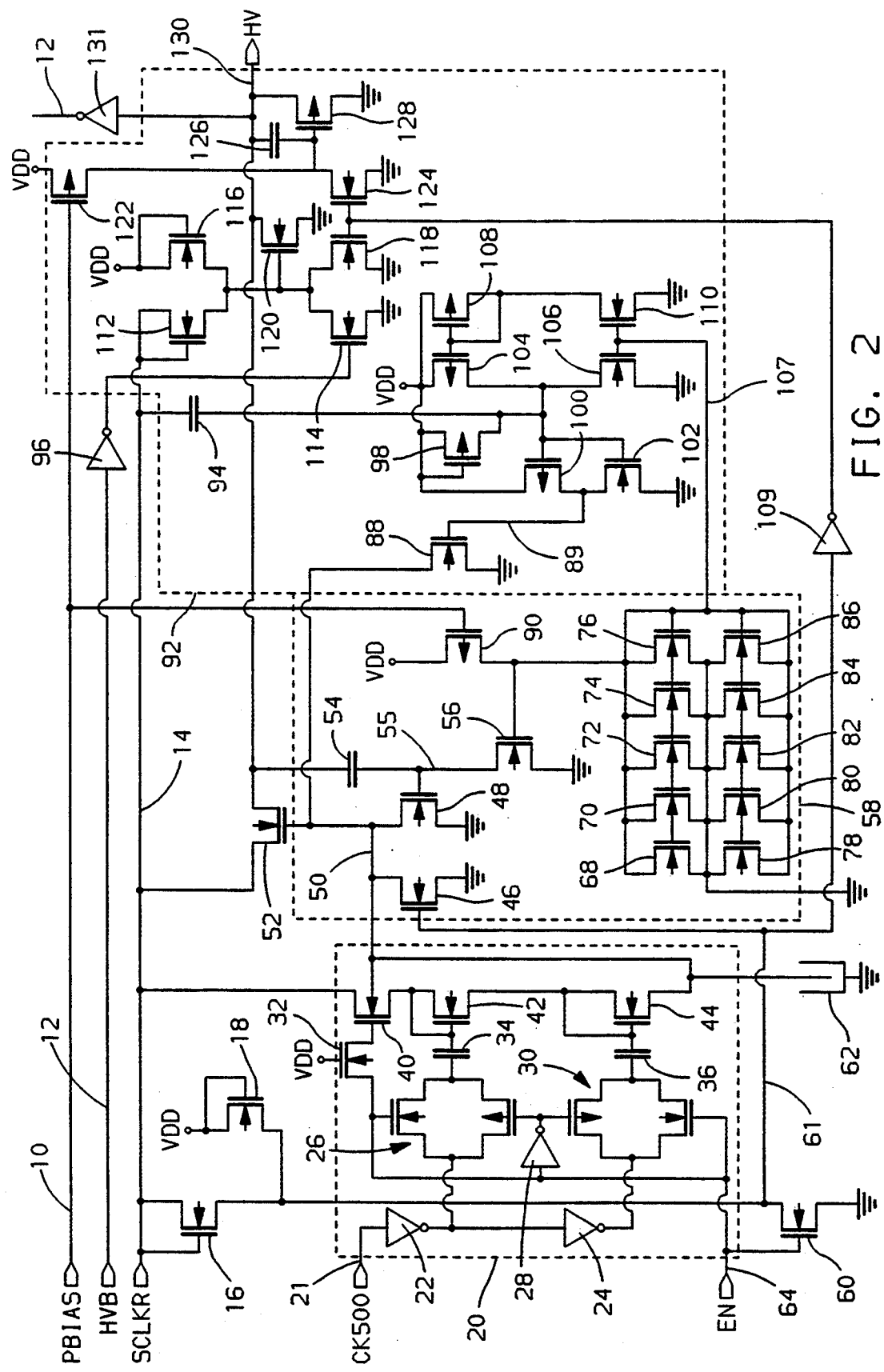
FIG. 2 illustrates the apparatus of this invention.

Referring to FIG. 2, the circuit of this invention shown comprises three main operational sections, charge pump 20 for controlling ramp-up of line 50, which is the gate input of transistor 52, ramping control circuit 58, which controls the ramp-up time of the programming signal output line 130 and pull-down circuit 92, which controls the ramp-down time of programming output line 130.

When programming signal input line 14 goes high (to approximately 14 volts), the enable signal EN appears on line 64, slightly trailing the programming signal on line 14. In response, charge pump 20 ramps-up the voltage level on line 50 to a voltage level approximately three to five volts higher than the voltage level on line 14. Line 50, then ramps-up the gate drive voltage signal of transistor 52, switching transistor 52 on. As transistor 52 switches on, it couples programming signal output line 130 to programming signal input line 14. As transistor 52 switches on, output line 130 is ramped-up at a rate controlled by ramping-control circuit 58 as capacitor 54 charges. The high voltage charge on line 50 ensures that transistor 52 is completely forward biased and has a minimum voltage drop, less than .1 volts.

When programming line 14 goes low, the enable signal EN on line 64 follows, also going low. The voltage drop on line 14 is sensed via capacitor 94 and ramp-down circuit 92. Ramp-down circuit 92 quickly pulls down line 50 quickly shutting off transistor 52. As a result, line 130 ramps-down at a rate controlled by the discharge of capacitor 126 over a time period of 15-20 microseconds.

More particularly, charge pump 20 receives a clock signal (i.e., at 500 kHz.) on line 21, to inverters 22 and 24. Inverters 22 and 24 responsively provide first and second clock signals in opposite phase to transmission gates 26 and 30. Transmission gates 26 and 30 are switched "active" by a high signal on enable line 64, which is coupled directly to the n-channel devices and which is coupled via inverter 28 to the p-channel devices. As transmission gates 26 and 30 are alternately switched on by the first and second clock signals, capacitors 34 and 36 alternately provide charge currents to transistors 42 and 44, alternately switching transistors 42 and 44 on and off.

Transistor 40 is connected in series with transistors 42 and 44 and capacitor 62 (a dual plate on-chip capacitor, i.e., 2 pF) between line 14 and ground. Transistor 40, held active by the enable signal on line 64, provides a current path from line 14 to the series circuit of transistors 42 and 44 and capacitor 62. As transistors 42 and 44 alternately switch on and off, capacitor 62 charges. As the charging action of charge pump 20 charges capacitor 62, line 50 rises to a voltage level between 3 and 5 volts above the level of the programming signal SCLK on programming input line 14.

In the event that the enable line 64 goes low, the source-to-drain voltage of inverting transistor 60 goes high, turning on transistor 46, which forces line 50 low.

As line 50 rises with the charging of charge pump 20, transistor 52 is gated on, coupling the programming signal from the programming input line 44 to the programming output line 130, which provides the programming output signal to EEPROM 206 (FIG. 1).

In the ramping control circuit 58, transistor 90 passes current at a level set by the voltage bias line 10 and by the channel size of transistor 90. For the example shown, line 10 is set at approximately 3.5 volts, which is at least one p-channel threshold below the voltage supply rail providing the voltage Vdd. Transistor 90 mirrors the current through transistors 68–86, which mirror the current to transistor 56 to pull line 55 low, maintaining transistor 48 off. Capacitor 54, on the other hand, tries to pull line 55 high from the signal coupled to line 130 through transistor 52. The charging of capacitor 54 is controlled by the amount of current allowed through transistor 56 which, in turn, is controlled by the current mirror transistors 68–86. This charging rate of capacitor 54 controls the ramp-up time of the programming output signal on line 130 so that the ramp-up time period is about 200 microseconds.

To regulate the rise of line 130, only a limited amount of current is allowed to flow from capacitor 54 through transistor 56. Too much current flow causes line 55 to go high, gating on transistor 48 and bringing the gate of transistor 52 low, thereby regulating the rate at which transistor 52 gates on and the rate at which the signal on line 130 rises.

The charging time of 200 microseconds is achieved with the capacitor value of 2 pF for capacitor 54, gate widths and lengths of 2 and 3 microns, respectively, for transistors 56 and 68–86, and a gate width and length of 9 and 10 microns, respectively, for transistor 90.

Once line 50 is ramped-up and line 130 is allowed to ramp-up, transistor 52 is fully on and provides a low impedance path between input programming signal line 14 and output programming signal line 130. When programming line 14 is high, normally transistors 98, 100 and 102 maintain line 89 low and transistor 88 off.

When the falling edge of the programming signal on line 14 is sensed via capacitor 94, transistor 100 quickly turns on bringing line 89 up to the supply voltage level and turning on transistor 88, which pulls line 50 to ground, quickly shutting off transistor 52. Transistors 106 and 110 mirror ten percent of the current from transistors 68–86 and, in conjunction with transistors 104 and 108, set the bias voltage for transistors 100 and 102 to a point where transistor 100 is barely turned off.

With transistor 52 shut off, capacitor 126 (1 pF) discharges through the circuit of transistors 122, 124 and 128, providing a fast and controlled ramp-down of the programming signal on line 130, with a ramp-down time of approximately 15–20 microseconds. Gate sizes for transistors 122 and 128 are 7.5 by 10 microns (width by length) and for transistor 124 is 5 by 2 microns (width by length).

Inverter 131 is coupled to line 130 and inverts the signal on line 130 so that, as line 130 goes low in response to line 14 going low and achieves a level about one n-threshold above ground, inverter 131 provides a high output signal on line 12. When line 12 goes high, inverter 96 provides a low signal to transistor 114 turning off transistor 114. When transistor 114 is off, the gate of transistor 120 goes high, maintaining line 130 at ground.

In the event that a programming signal is received on line 14, but no Vdd voltage supply is present, the circuit of this invention inhibits transfer of the programming signal to the programming output line 130. Transistor 16 brings line 61 high, disabling the circuit, if no VDD is present, as follows. When line 61 is high, which also occurs when enable line 64 goes low, transistor 46 is turned on pulling line 50 to ground, maintaining transistor 52 off so that no programming signals can be transferred from line 14 to line 130. Also when line 61 is high, inverter 109 inverts the signal on line 61 to provide a low signal to transistors 118 and 124 maintaining transistors 118 and 124 off. When transistor 124 is off, transistor 128 is biased positive by transistor 122 and provides a discharge path from line 130 to ground via the source drain circuit of transistor 128. Capacitor 126 affects the rate of discharge of line 130. Also, when transistor 118 is off, the gate of transistor 120 is pulled high by transistor 112 and/or transistor 116, turning on transistor 120, which maintains line 130 low.

Figure 3:
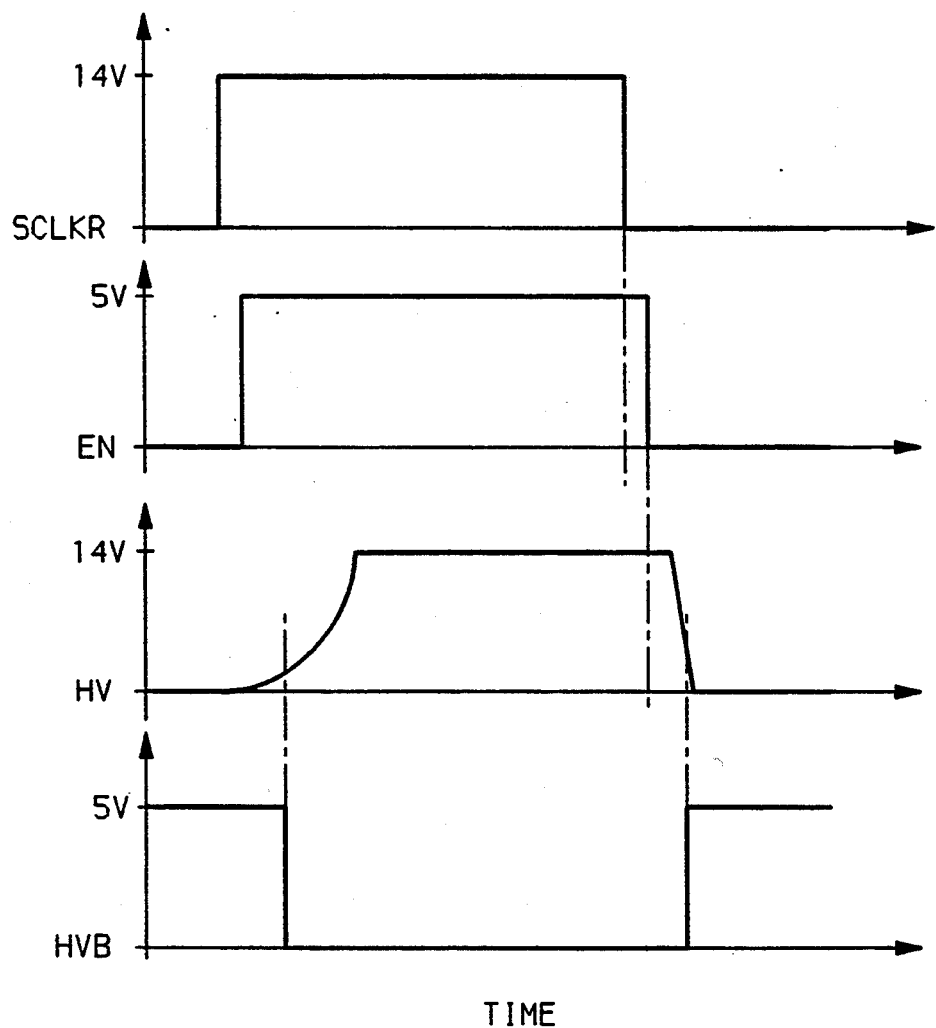
FIG. 3 is a timing diagram illustrating the operation of this invention.

Referring to FIG. 3, the timing diagram shows the circuit signals SCLK on line 14, EN on line 64, HV on line 130 and HVB on line 12. The programming signal SCLK (on line 14) goes high and logic circuit 202 brings the enable signal EN on line 64 high immediately following rising edge of SCLK. When EN goes high, transistors 46, 120 and 128, which, when on, bias line 130 to ground, turn off. As shown, the signal HV on line 130 responsively ramps up. When the programming signal SCLK goes low, logic circuitry (202, FIG. 1) provides, immediately thereafter, a drop of the enable signal EN as shown, which causes, as explained above, transistor 128 to be gated on, allowing line 130 to ramp-down via discharge of capacitor 126 through transistor 128. When line 130 reaches approximately one n-threshold above ground, HVB, which is the output of inverter 131, goes high as shown.

FIG. 4 illustrates as trace 152, the ramping-up and down of the signal HV on line 130 and, as trace 150, the ramping-up and down of the signal on line 50 driving the gate of transistor 52.

Advantageously, the circuitry described above prevents forward biasing of junctions in EEPROM circuitry by controlling the ramp-down time to be a minimum of 10 microseconds. If the ramp-down time of the programming signal on line 130 is too fast, junctions in EEPROM circuitry may be forward biased causing current to be dumped into the substrate and unwanted parasitic activity.

The above-described implementation of this invention is an example implementation. The input signals described can be easily implemented by those skilled in the art using appropriate logic circuitry. Various improvements and modifications to this invention may occur to those skilled in the art and such improvements and modifications will fall within the scope of this invention as set forth below.

The embodiments of the invention in which an exclusive property or privilege is claimed are defined as follows:

1. An Apparatus comprising:

a charge pump circuit comprising means for receiving a programming input signal on a programming input line and means for charging up a gate drive voltage signal in response to a rising edge of the programming input signal;

a first transistor coupling the programming input line to a programming output line, which is coupled to an EEPROM, the first transistor including a gate coupled to the gate drive voltage signal;

a ramp control circuit coupled to the programming output line comprising means for regulating a ramp-up rate of a programming output signal on the programming output line, the ramp control circuit including a first capacitor and a second transistor connected in series the series connected first capacitor and second transistor being coupled between the programming output line and ground, where the second transistor controls the flow of current through the first capacitor to regulate the ramp-up rate of the programming output signal; and a ramp-down circuit coupled to the programming input line and comprising means responsive to the programming input signal for providing a ramp-down of the programming output signal after the programming input signal goes low.

2. The apparatus of claim 1, wherein the ramp control circuit further includes a third transistor having a source and a drain coupled between the programming input line and ground and having a gate coupled between the series connected first capacitor and second transistor, the third transistor controlling a rate at which the first transistor turns on to further regulate the ramp-up rate of the programming output signal.

3. The apparatus of claim 1, wherein the ramp down circuit comprises:

sensing means coupled to the programming input line for sensing a falling edge of the programming input signal;

a fourth transistor having a source and a drain coupled between the gate of the first transistor and ground, the fourth transistor having a gate coupled to the sensing means for turning the fourth transistor on in response to the sensed falling edge of the programming input signal;

a fifth transistor having a source and a drain coupled between the programming output line and ground and having a gate coupled to the sensing means for turning the fifth transistor on in response to the sensed falling edge of the programming input signal; and a second capacitor connected between the programming output line and the gate of the fifth transistor and discharging when the fifth transistor is turned on to control the ramp-down of the programming output signal.

4. An apparatus for providing a programming output signal for programming a memory circuit comprising:

a charge pump circuit including input means for receiving a programming input signal on a programming input line and charging means for charging up a gate drive voltage signal in response to a rising edge of the programming input signal;

a first transistor for coupling the programming input line to a programming output line and including a gate coupled to the gate drive voltage signal;

the ramp control circuit including a first capacitor and a second transistor connected in series, the series connected first capacitor and second transistor being coupled between the programming output line and ground, and a third transistor having a source and a drain coupled between the programming input line and ground and having a gate coupled between the series connected first capacitor and second transistor to control current flow through the first capacitor and regulate a ramp-up rate of a programming output signal on the programming output line; and a ramp-down circuit coupled to the programming input line and comprising means responsive to the programming input signal for providing a ramp-down of the programming output signal after the programming input signal goes low.

* * * * *